United States Patent
Masuyama et al.

(10) Patent No.: US 9,329,077 B2
(45) Date of Patent: May 3, 2016

(54) SEMICONDUCTOR PHOTODETECTOR DEVICE

(71) Applicant: Mitsubishi Electric Corporation, Tokyo (JP)

(72) Inventors: Yuji Masuyama, Isahaya (JP); Masaharu Nakaji, Tokyo (JP); Yoshihiro Hisa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 277 days.

(21) Appl. No.: 14/065,477

(22) Filed: Oct. 29, 2013

(65) Prior Publication Data

US 2014/0224967 A1 Aug. 14, 2014

(30) Foreign Application Priority Data

Feb. 13, 2013 (JP) ................................. 2013-025660

(51) Int. Cl.
*H03F 3/08* (2006.01)
*G01J 1/02* (2006.01)
*H01L 31/0203* (2014.01)

(52) U.S. Cl.
CPC .............. *G01J 1/0204* (2013.01); *G01J 1/0271* (2013.01); *H01L 31/0203* (2013.01); *H01L 2224/45144* (2013.01); *H01L 2224/48091* (2013.01); *H01L 2224/48137* (2013.01); *H01L 2224/48465* (2013.01); *H01L 2224/73265* (2013.01)

(58) Field of Classification Search
CPC ......... G01J 1/0204; G01J 1/0271; G01J 1/44; H01L 31/0203; H01L 2224/45144; H01L 2224/48091; H01L 2224/48137; H01L 2224/48465; H01L 2224/73265; H01L 31/0232; H01L 31/09; H01L 27/14618; H03G 3/3084; H04N 5/2253
USPC ........ 250/214 A, 214.1, 214 R, 239; 372/109
See application file for complete search history.

(56) References Cited

U.S. PATENT DOCUMENTS

| | | | |
|---|---|---|---|
| 2003/0081297 A1 | 5/2003 | Hasegawa et al. | |
| 2006/0220038 A1 | 10/2006 | Iguchi et al. | |
| 2007/0201881 A1* | 8/2007 | Douma ................ | G02B 6/4246 398/202 |
| 2007/0228535 A1* | 10/2007 | Fujino ................. | H01S 5/02244 257/678 |

FOREIGN PATENT DOCUMENTS

| | | |
|---|---|---|
| JP | 5-4534 U | 1/1993 |
| JP | 2003-134051 A | 5/2003 |
| JP | 2006-253676 A | 9/2006 |

OTHER PUBLICATIONS

State Intellectual Property Office of the People's Republic of China; Office Action in Chinese Patent Application No. 201310614577.7 (Oct. 28, 2015).

* cited by examiner

*Primary Examiner* — Thanh Luu
(74) *Attorney, Agent, or Firm* — Leydig, Voit & Mayer, Ltd.

(57) ABSTRACT

A semiconductor photodetector device includes a header, a high frequency amplifier, and a submount having a top surface. The high frequency amplifier is located on the header and has a top surface with a high frequency grounding pad disposed on the top surface of the amplifier. First and second electrode pads are located on the top surface of the submount. A semiconductor photodetector having a footprint smaller than the first electrode pad is bonded to the first electrode pad. The high frequency grounding pad is connected to the second electrode pad by a wire.

7 Claims, 12 Drawing Sheets

HIGH FREQUENCY AMPLIFIER AMP SIDE

↓
HIGH FREQUENCY AMPLIFIER AMP SIDE

↓
HIGH FREQUENCY AMPLIFIER AMP SIDE

HIGH FREQUENCY AMPLIFIER AMP SIDE

HIGH FREQUENCY AMPLIFIER AMP SIDE

↓
HIGH FREQUENCY AMPLIFIER AMP SIDE

↓
HIGH FREQUENCY AMPLIFIER AMP SIDE

HIGH FREQUENCY AMPLIFIER AMP SIDE

X2-X2' SECTION

RELATED ART

A-A' SECTION

B-B' SECTION

SEMICONDUCTOR PHOTODETECTOR DEVICE

FIELD OF THE INVENTION

The present invention relates to a semiconductor photodetector device.

BACKGROUND ART

There have been known semiconductor photodetector devices in which electronic components are mounted in a recess formed in a mounting base called a stem or header, as disclosed, e.g., in Japanese Laid-Open Patent Publication No. 2006-253676. Specifically, in the semiconductor photodetector device disclosed in this publication, a semiconductor photodetector and a preamplifier IC are mounted in a recess formed in the main surface of a stem. The mounting region in the recess where the semiconductor photodetector and the preamplifier IC are mounted is at a lower elevation than the rest of the main surface. This makes it possible to reduce the length of the wires wire-bonded from electrodes of the preamplifier IC to the surface of the stem.

Other prior art includes Japanese Utility Model Laid-Open Patent Publication No. H05-004534 and Japanese Laid-Open Patent Publication No. 2003-134051.

The semiconductor photodetector device disclosed in the above publication has a so-called CAN package structure, and wires are wire-bonded to the top surface of the header, or stem. Since such wire bonding requires a certain amount of surface area on the top surface of the header, the top surface must have a relatively large surface area, or have a relatively low density of electronic components thereon.

SUMMARY OF THE INVENTION

The present invention has been made to solve the above problem. It is, therefore, an object of the present invention to provide a semiconductor photodetector device in which the number of wires wire-bonded to the top surface of the header is reduced.

According to one aspect of the present invention, a semiconductor photodetector device includes: a header; a high frequency amplifier; a submount; a semiconductor photodetector. The high frequency amplifier is provided on the header and has a top surface with a high frequency grounding pad disposed thereon. The submount is provided on the header and has a top surface. The semiconductor photodetector is provided on the top surface of the submount and has a footprint smaller than the top surface of the submount. Wherein, the top surface of the submount has thereon a first electrode pad to which the semiconductor photodetector is bonded, and a second electrode pad disposed adjacent the first electrode pad, and wherein a wire is connected at one end to a connection point on the high frequency grounding pad and at the other end to a connection point on the second electrode pad.

Other and further objects, features and advantages of the invention will appear more fully from the following description.

DETAILED DESCRIPTION OF THE PREFERRED EMBODIMENTS

Configuration of Device of Embodiment

Figure 1:
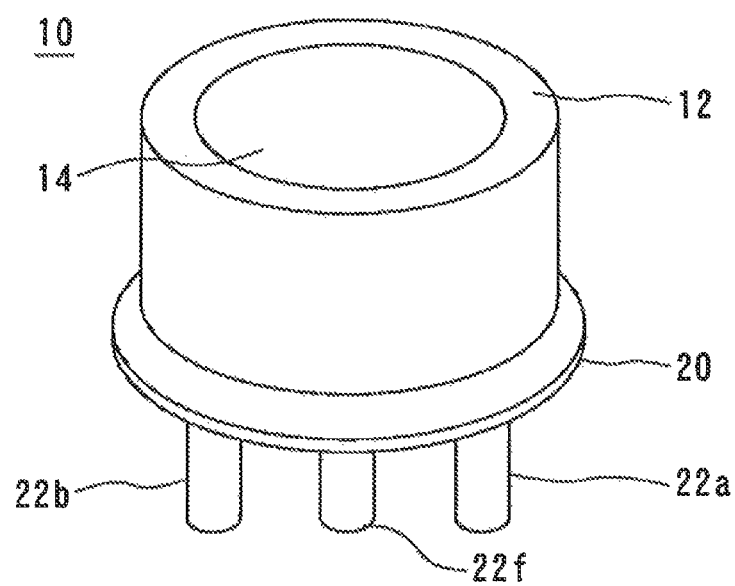
FIG. 1 is a diagram showing the external configuration of a semiconductor photodetector device in accordance with an embodiment of the present invention.

FIG. 1 is a diagram showing the external configuration of a semiconductor photodetector device 10 in accordance with an embodiment of the present invention. The semiconductor photodetector device 10 is a so-called CAN package and includes a cap 12, a header 20, and other components, which are mounted on the header 20 and covered by the cap 12. The cap 12 has a window 14 of glass, and the semiconductor photodetector APD in the semiconductor photodetector device 10 receives light through the window 14. The cap 12 is made of a metal. The header 20 and the cap 12 are secured together by electrically welding the flange of the cap 12 to the flange 20a of the header 20 in such a manner that the space enclosed by the header 20 and the cap 12 is hermetically sealed. The space is filled with a filler gas such as air, dry gas, or nitrogen gas. It should be noted that if the cap 12 is made of a resin, it is bonded to the header 20 by an adhesive.

Figure 2:
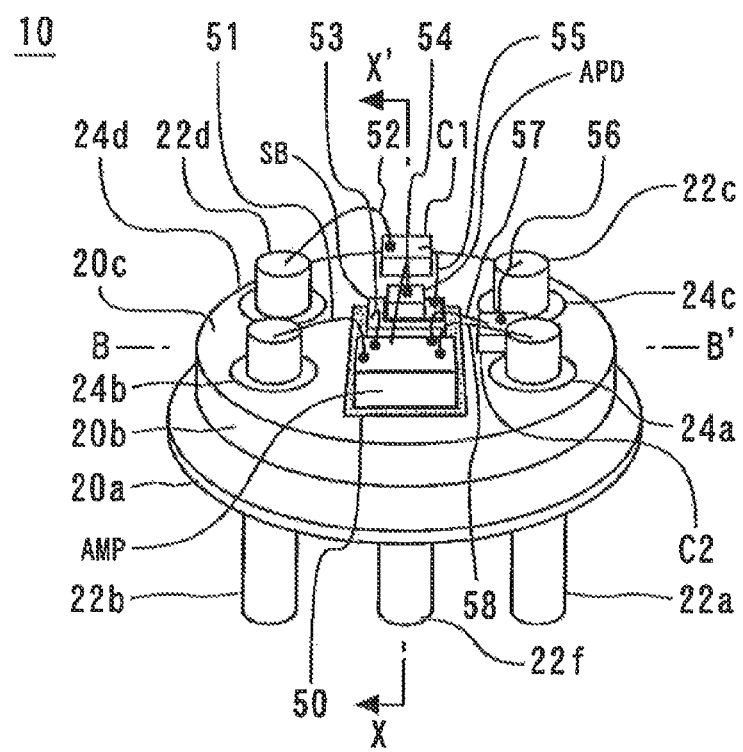
FIG. 2 is a diagram showing the internal configuration of the semiconductor photodetector device of the present embodiment.
Figure 3:
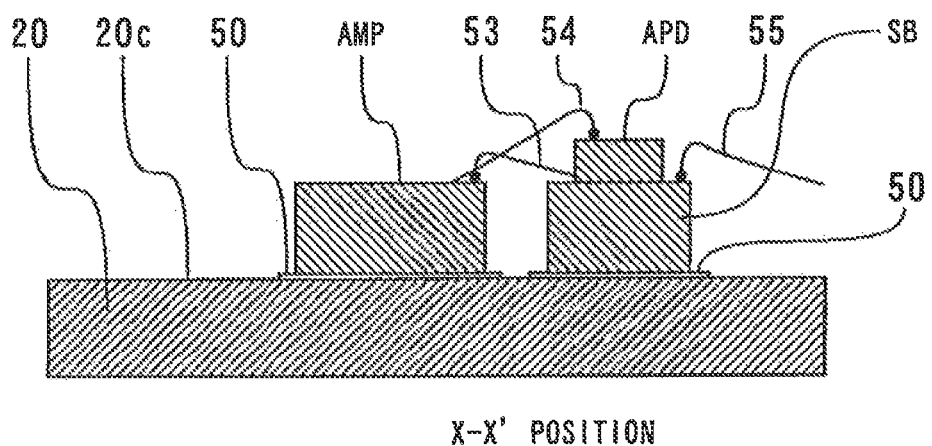
FIG. 3 is a cross-sectional view taken along line X-X' of FIG. 2 and viewed in the direction of the arrows.
Figure 4:
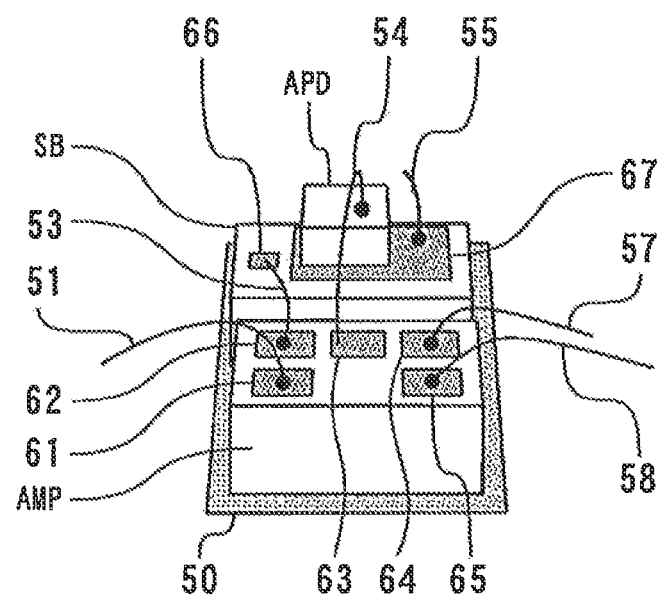
FIG. 4 is an enlarged perspective top view of the submount and the adjacent components of the semiconductor photodetector device of the present embodiment.
Figure 5:
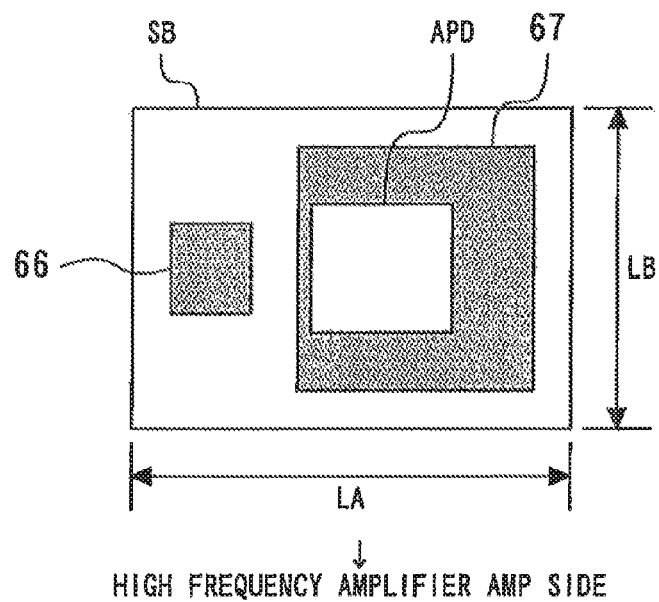
FIG. 5 is a top view showing the components on the top surface of the submount of the semiconductor photodetector device of the present embodiment.

FIG. 2 is a diagram showing the internal configuration of the semiconductor photodetector device 10 of the present embodiment. FIG. 3 is a cross-sectional view taken along line X-X' of FIG. 2 and viewed in the direction of the arrows. FIG. 4 is an enlarged perspective top view of the submount SB and the adjacent components of the semiconductor photodetector device 10 of the present embodiment. FIG. 5 is a top view showing the components on the top surface of the submount SB of the semiconductor photodetector device 10 of the present embodiment.

It should be noted that the surface of the submount SB facing toward the window 14 is referred to herein as the top surface of the submount SB. Further, the surface of the high frequency amplifier AMP on the submount SB facing toward the window 14 is referred to herein as the top surface of the high frequency amplifier AMP.

As shown in FIGS. 2 to 4, the semiconductor photodetector device 10 includes the header 20, on which various components are mounted. The header 20 has the flange 20a, a disc portion 20b, and a top surface 20c on which is mounted the high frequency amplifier AMP, which has a high frequency grounding pad 62. The high frequency amplifier AMP amplifies the output signal from the semiconductor photodetector APD. Further, the submount SB is disposed on the top surface 20c adjacent the high frequency amplifier AMP.

The submount SB has an electrode pad 67 to which the semiconductor photodetector APD is bonded, and an electrode pad 66 disposed adjacent the electrode pad 67. The semiconductor photodetector APD, which is bonded to the top surface of the submount SB, has a footprint smaller than the top surface of the submount SB. The semiconductor photodetector APD is an avalanche photodiode.

The surface of the header 20 is plated with gold. The high frequency amplifier AMP and the submount SB are bonded to the surface of the header 20 by silver paste 50. The silver paste 50 includes silver and a binder resin. The use of silver paste for bonding enhances productivity. A capacitor C1 and a capacitor C2 are also mounted on the top surface 20c of the header 20.

The header 20 is provided with lead pins 22a, 22b, 22c, 22d, and 22f, which are herein referred to collectively as the lead pins 22. The lead pins 22 are bar terminals. Although in this example the header 20 has five lead pins 22, in other examples the header 20 may have six or more lead pins 22. The semiconductor photodetector device 10 is configured as a differential signal system; signals are output from two terminals (namely, lead pins 22a and 22b). The lead pin 22f is welded to the bottom surface of the header 20 between the lead pins 22a and 22b. The lead pin 22f is used for grounding and welded to the bottom surface of the header 20. Unlike other lead pins, the lead pin 22f does not project from the top surface of the header 20 and, furthermore, glass hermetic material is not provided between the lead pin 22f and the header 20, that is, the lead pin 22f is electrically connected to the header 20.

The header 20 is made of a metal and may be, e.g., a circular ion plate having a diameter of approximately 3-10 mm. The header 20 has four through-holes therein, each receiving a respective one of the lead pins 22a, 22b, 22c, and 22d. The lead pins 22a, 22b, 22c, and 22d are bonded to the header 20 by glass hermetic materials 24a, 24b, 24c, and 24d, respectively. These hermetic materials also seal the gaps between the lead pins 24a, 24b, 24c, and 24d and their respective through-holes of the header 20.

Selected ones of the components on the header 20 are electrically connected together by wires 51 to 58 serving as signal lines. These wires 51 to 58 are metal wires. In the present embodiment, they are gold wires. The wire 51 connects the high frequency amplifier AMP to the tip of the lead pin 22b. The wire 52 connects the capacitor C1 to the tip of the lead pin 22d. The wire 53 connects the high frequency amplifier AMP to the submount SB. The wire 54 connects the semiconductor photodetector APD to the high frequency amplifier AMP so that the output of the semiconductor photodetector APD is applied to the high frequency amplifier AMP. The wire 55 connects the capacitor C1 to the submount SB. The wire 56 connects the capacitor C2 to the tip of the lead pin 22c. The wire 57 connects the capacitor C2 to the high frequency amplifier AMP. The wire 58 connects the high frequency amplifier AMP to the tip of the lead pin 22a. It should be noted that in FIGS. 2 and 4 each black circle indicates the end of a wire at which a first ball bond has been formed; a second ball bond has been formed at the other end of the wire.

As shown in FIG. 4, the high frequency amplifier AMP has an electrode pad 61, a high frequency grounding pad 62, an electrode pad 63, an electrode pad 64, and an electrode pad 65 on the top surface thereof. Each of the wires 51, 53, 54, 57, and 58 is bonded to a respective one of these electrode pads.

As shown in FIG. 5, the electrode pad 66 and the electrode pad 67 are provided on the top surface of the submount SB. The submount SB has a long side having a length LA and a short side having a length LB. In the present embodiment, the electrode pad 66 is substantially smaller than the electrode pad 67, and the semiconductor photodetector APD is bonded to the electrode 67 in such a manner that the semiconductor photodetector APD is located substantially at the center of the top surface of the submount SB.

The high frequency grounding pad 62 of the high frequency amplifier AMP is connected to the electrode pad 66 by the wire 53. In the wire bonding process, a first bond is formed between one end of the wire 53 and the high frequency grounding pad 62 and then a second bond is formed between the other end of the wire 53 and the electrode pad 66. The submount SB is typically made of a dielectric material such as ceramic and forms a capacitor. This means that the submount SB acts as an insulator for DC and low frequency signals and acts as a conductor for high frequency signals. Therefore, the wire 53 is substantially grounded for high frequency signals through the submount SB.

Thus, since the top surface of the submount SB is greater than the footprint of the semiconductor photodetector APD, the high frequency grounding pad 62 is provided on the top surface in an area not occupied by the semiconductor photodetector APD. In this way, the available area on the top surface of the submount SB is utilized for wire connection for high frequency grounding. This makes it possible to reduce the number of wires wire-bonded to the top surface 20c of the header 20. In the present embodiment, no wire is wire-bonded to the top surface 20c of the header 20.

Thus, the submount SB additionally functions as a grounding conductor for high frequency grounding, eliminating the need to connect a wire for high frequency grounding to the header 20. This increases the available area on the header 20, resulting in increased freedom in designing the semiconductor photodetector device 10. Further, in the present embodiment, the top surface of the high frequency amplifier AMP is substantially level with the top surface of the submount SB. Therefore, the wire 53 for high frequency grounding, which is connected to the submount SB by a second bond, can be very short. This results in decreased impedance (particularly, inductance) of the wire 53 and hence increased response speed of the semiconductor photodetector device 10.

Figure 6:
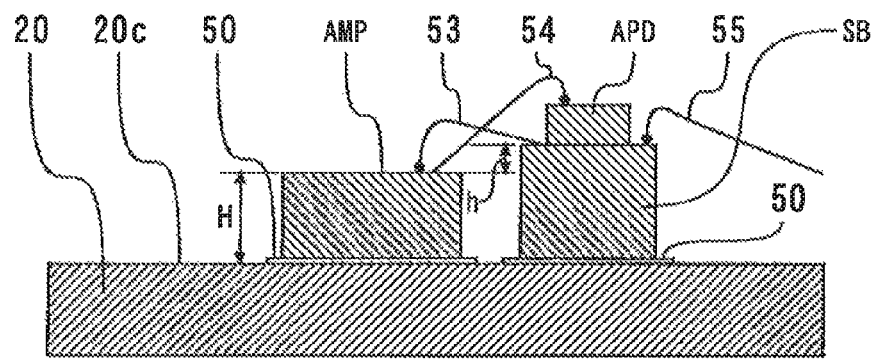
FIG. 6 is a diagram showing the configuration of a variation of the semiconductor photodetector device of the present embodiment.

Referring to FIG. 6, the height (or distance) of the high frequency grounding pad 62 relative to the top surface 20c of the header 20 is denoted by the letter "H." Further, the difference between this height H and the height of the electrode pad 66 relative to the top surface 20c of the header 20 is denoted by the letter "h." In the present embodiment, the height of submount SB is substantially equal to that of the high frequency amplifier AMP, and hence the height difference h is substantially zero. This means that the wire 53 for high frequency grounding is wire-bonded between points at substantially the same level, thus facilitating the bonding procedure.

The submount SB and the high frequency amplifier AMP are bonded to the header 20 by silver paste 50. It should be noted that the resin component of the silver paste 50 may leak along the gold plating covering the surface of the header 20, depending on the type of silver paste used. If a wire (such as the high frequency grounding wire 53) were bonded to the top surface 20c of the header 20 as in prior art, the leaked resin component might affect the quality of this bonding. In the present embodiment, on the other hand, the high frequency grounding wire 53 is bonded to the top surface of the submount SB instead of to the top surface 20c of the header 20. Therefore, the leaked resin component of the silver paste 50 described above does not affect the bonding of the high frequency grounding wire 53. (It should be noted that the top and side surfaces of the high frequency amplifier AMP and the submount SB are not covered with gold plating.)

Variations of Embodiment

FIG. 6 is a diagram showing the configuration of a variation of the semiconductor photodetector device 10 of the present embodiment. In this semiconductor photodetector device, the height of the submount SB is not equal to that of the high frequency amplifier AMP. However, since the difference h between the height H of the high frequency grounding pad 62 and the height of the electrode pad 66 relative to the top surface 20c of the header 20 is smaller than the height H of the high frequency grounding pad 62, the high frequency grounding wire 53 can be bonded between points at relatively closely spaced levels, thus facilitating the bonding procedure.

Figure 7:
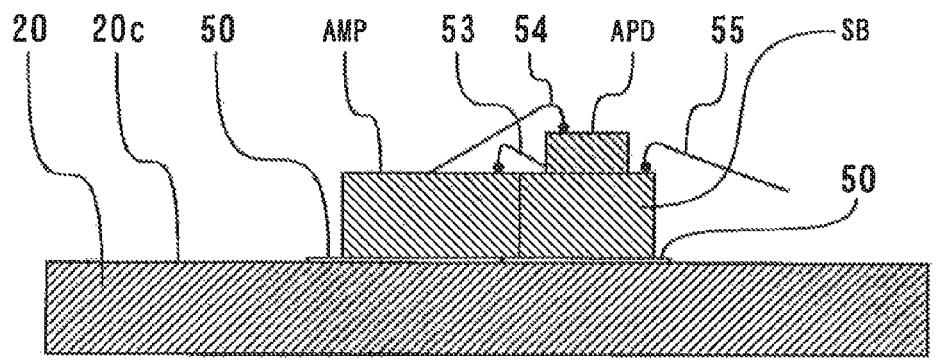
FIGS. 7 and 8 are diagrams showing the configuration of another variation of the semiconductor photodetector device of the present embodiment.
Figure 8:
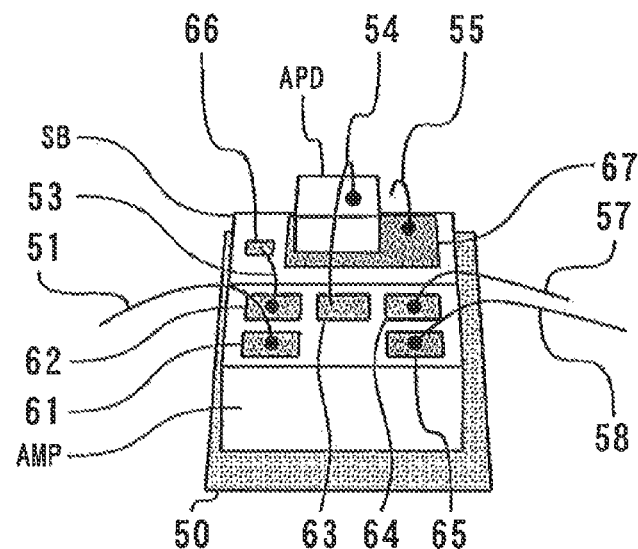

FIGS. 7 and 8 are diagrams showing the configuration of another variation of the semiconductor photodetector device 10 of the present embodiment. As shown in FIG. 7, the high frequency amplifier AMP and the submount SB are disposed in contact with each other on the top surface 20c of the header 20, thereby minimizing the lengths of the wires 53 and 54. In FIG. 7, sides of the high frequency amplifier AMP and the submount SB are shown to be flat and in close contact with each other, for simplicity of illustration. However, for example, the side of the high frequency amplifier AMP facing the submount SB may have a projection, e.g., a terminal. In such cases, this projection may be in contact with a side of the submount SB. FIG. 8 is a perspective top view of the components shown in FIG. 7.

Figure 9:
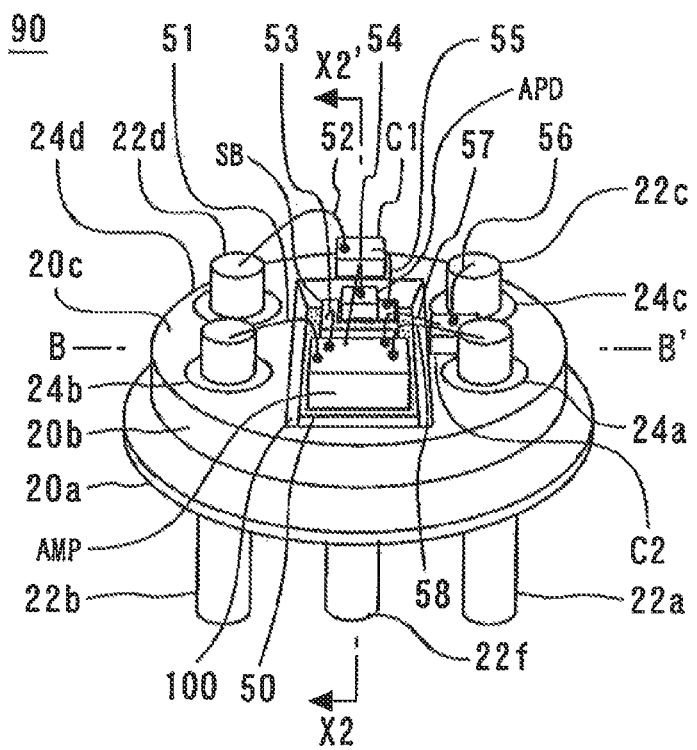
FIG. 9 is a diagram showing a semiconductor photodetector device which is a variation of the semiconductor photodetector device of the present embodiment.
Figure 10:
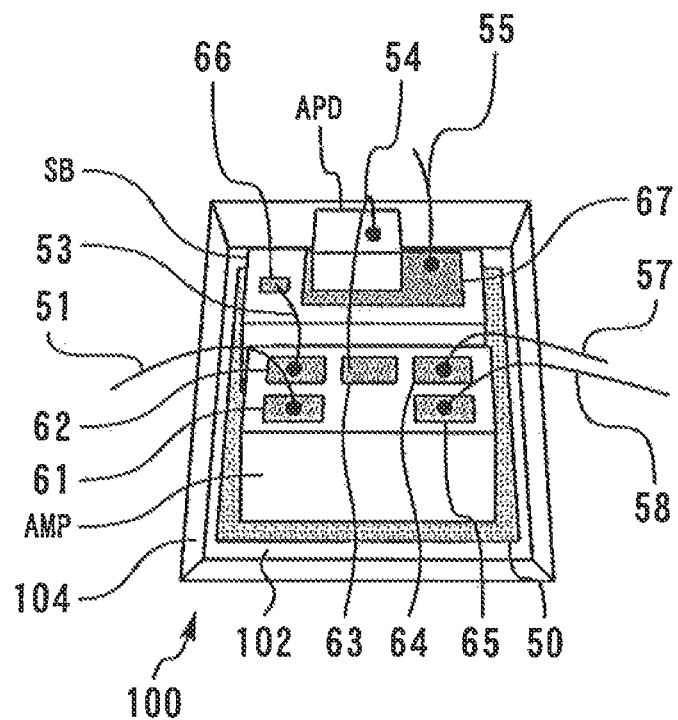
FIG. 10 is a perspective top view of the components in a recess.
Figure 11:
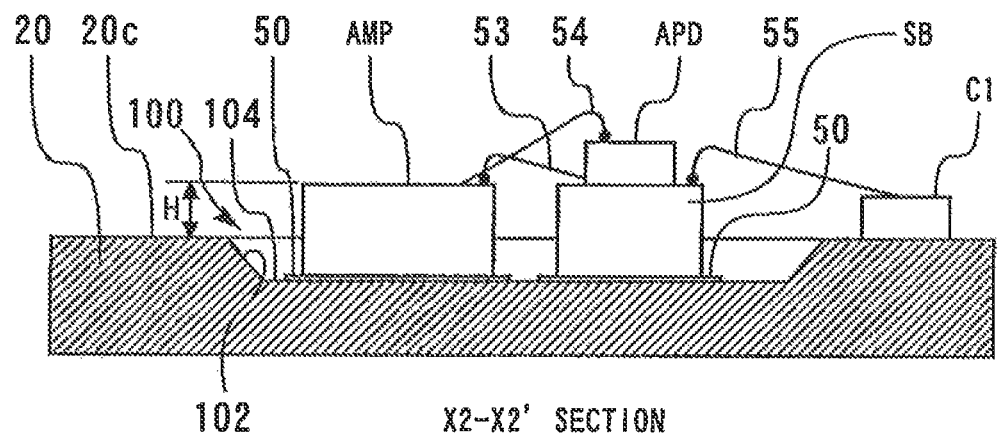
FIG. 11 is a cross-sectional view taken along line X2-X2' of FIG. 9 and viewed in the direction of the arrows.
Figure 12:
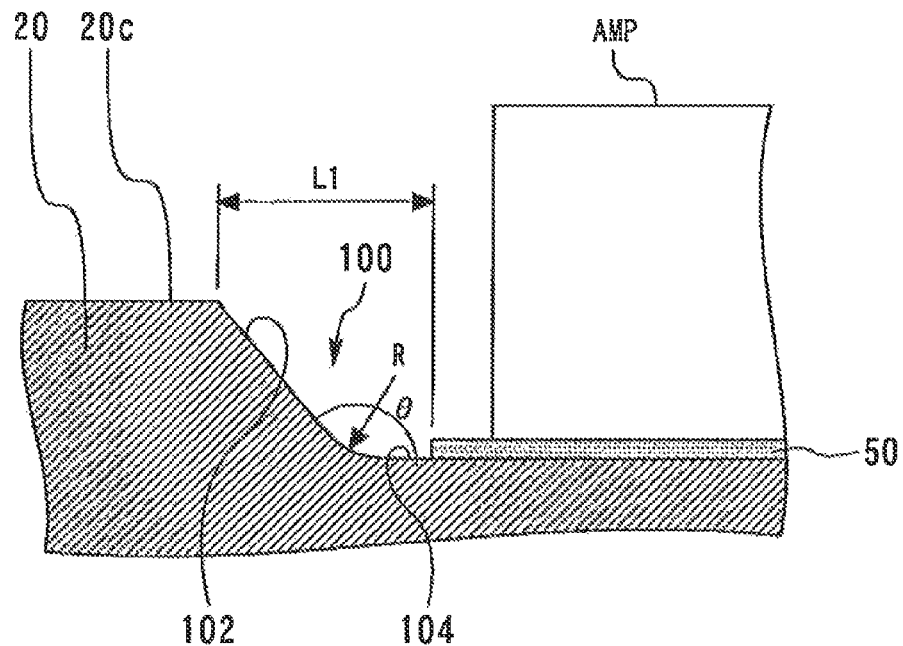
FIG. 12 is an enlarged cross-sectional view of a portion of the semiconductor photodetector device taken along line B-B' of FIG. 9, showing one side of the high frequency amplifier and the adjacent portion of the header.

FIG. 9 is a diagram showing a semiconductor photodetector device 90 which is a variation of the semiconductor photodetector device 10 of the present embodiment. In the semiconductor photodetector device 90, a recess 100 is formed in the upper surface 20c of the header 20, and the high frequency amplifier AMP and the submount SB are mounted in this recess. Except for this feature the semiconductor photodetector device 90 is similar to the semiconductor photodetector device 10. The recess 100 has a bottom surface 104 and a side 102 surrounding the bottom surface 104. The high frequency amplifier AMP and the submount SB are bonded to the bottom surface 104 by silver paste 50. FIG. 10 is a perspective top view of the components in the recess 100, and FIG. 11 is a cross-sectional view taken along line X2-X2' of FIG. 9 and viewed in the direction of the arrows. Since the high frequency amplifier AMP and the submount SB (with the semiconductor photodetector APD thereon) are disposed in the recess 100, the heights of the their top surfaces relative to the plane of the top surface 20c of the header 20 are relatively small. As a result, the wire 55 for connecting the capacitor C1 to the submount SB is relatively short and is bonded between points at substantially the same level, thus facilitating the bonding procedure. FIG. 12 is an enlarged cross-sectional view of a portion of the semiconductor photodetector device 90 taken along line B-B' of FIG. 9, showing one side of the high frequency amplifier AMP and the adjacent portion of the header 20. As shown in FIG. 12, the bottom surface 104 and the side 102 of the recess 100 form an angle θ which is greater than 90 degrees.

The recess 100 is typically formed in the top surface 20c of the header 20 by stamping. In such cases, the bottom edge of the recess 100 has a radius of curvature R. As a result of this curved configuration, the high frequency amplifier AMP cannot be disposed adequately close to the edge of the bottom surface of the recess 100 (or the side 102 of the recess 100). Therefore, if a wire is to be bonded between the high frequency grounding pad 62 and the wiring area of the top surface 20c of the header 20, then the wire must be selected to be relatively long, since the curved configuration of the bottom edge of the recess 100 prevents the high frequency amplifier AMP from being moved adequately close to the side 102 of the recess 100.

Figure 13:
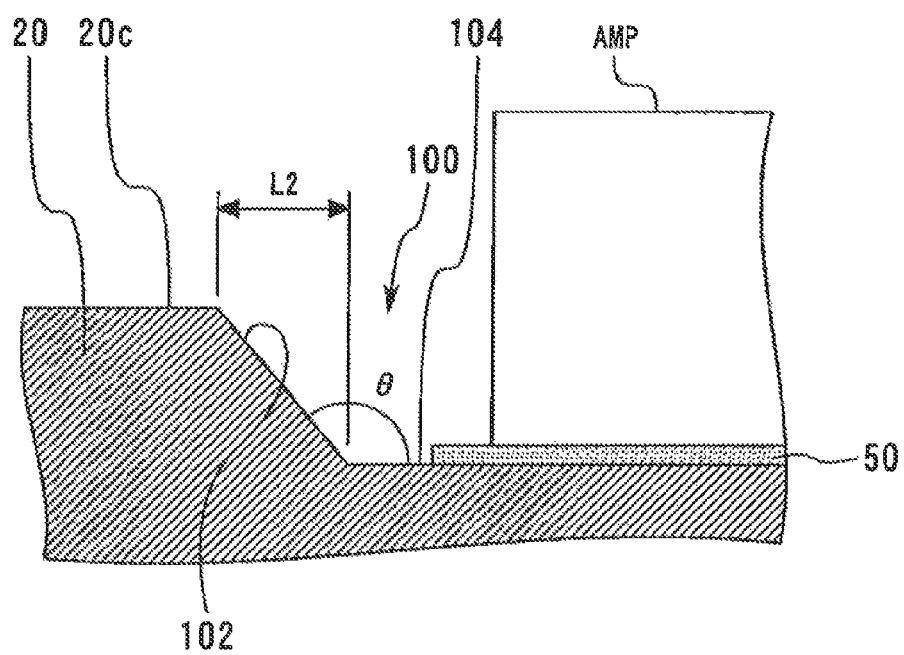
FIG. 13 is an enlarged cross-sectional view of a portion of the semiconductor photodetector device taken along line B-B' of FIG. 9, showing one side of the high frequency amplifier and the adjacent portion of the header, wherein the recess has been formed by cutting.
Figure 14:
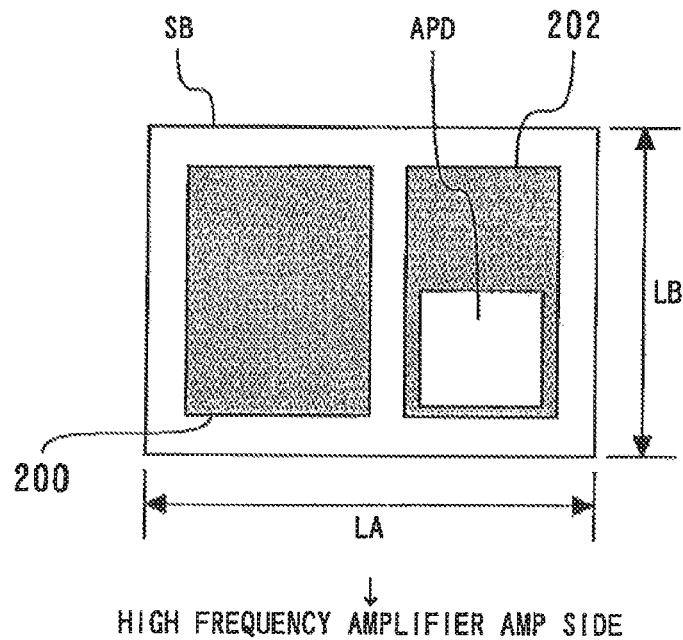
FIGS. 14 to 20 are diagrams showing variations of the submount of the semiconductor photodetector device of the present embodiment.

The recess 100 may be formed by cutting, instead of stamping, so that the bottom edge of the recess 100 has no curvature. FIG. 13 is an enlarged cross-sectional view of a portion of the semiconductor photodetector device 90 taken along line B-B' of FIG. 9, showing one side of the high frequency amplifier AMP and the adjacent portion of the header 20, wherein the recess 100 has been formed by cutting. However, forming the recess 100 by cutting results in increased manufacturing cost of the header 20. Furthermore, as shown in FIG. 13, the side 102 of the recess 100 is not perpendicular to the bottom surface 104 even if the recess 100 is formed by cutting; the top edge and the bottom edge of the recess 100 are spaced a substantial lateral distance L2 from each other.

It should be noted that in the semiconductor photodetector device 90, the high frequency amplifier AMP need not be positioned close to the side 102 of the recess 100 since the wire 53 is connected from the high frequency grounding pad 62 to the electrode pad 66 of the submount SB instead of to the top surface 20c of the header 20, thus eliminating the above problem associated with the configuration of the recess 100.

The point on the high frequency grounding pad 62 where the wire 53 is connected is spaced from the closest edge of the recess 100 by a first distance in a direction parallel to the top surface 20c of the header 20 and spaced from the point on the electrode pad 66 where the wire 53 is connected by a second distance in that direction with the second distance being smaller than the first distance.

Figure 15:
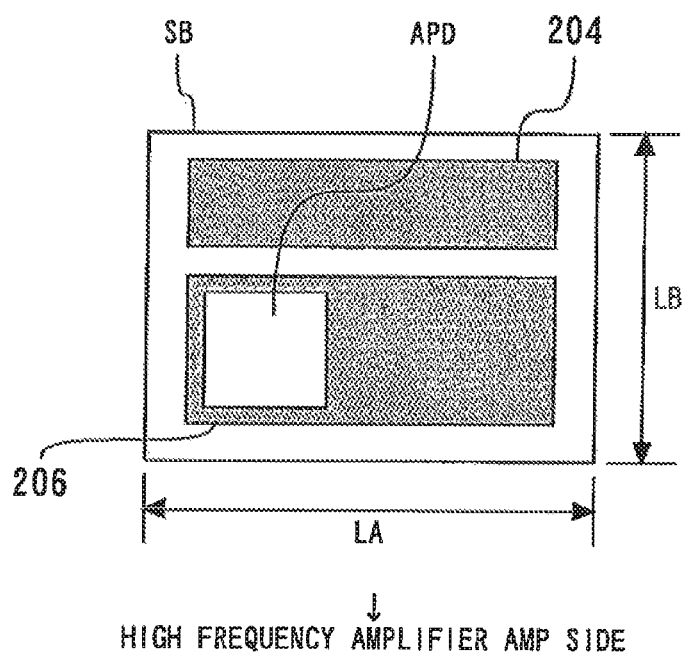

FIGS. 14 to 20 are diagrams showing variations of the submount SB of the semiconductor photodetector device 10 of the present embodiment. Whereas the submount SB of the present embodiment has a high frequency amplifier substantially at the center of its top surface (see FIG. 5), each of the submounts shown in FIGS. 14 to 20 has a high frequency amplifier on its lower side, as viewed in the figure, and further differs from the submount SB of the present embodiment in that the electrode pads 66 and 67 are replaced by different electrode pads. The submount shown in FIG. 14 has an electrode pad 200 and an electrode pad 202 instead of the electrode pad 66 and the electrode pad 67, respectively, of the first embodiment. The electrode pad 200 has a larger surface area than the electrode pad 66 whereas the electrode pad 202 has a smaller surface area than the electrode pad 67 so that both the electrode pad 200 and the electrode pad 202 are accommodated on the top surface of the submount. The semiconductor photodetector APD is bonded to the electrode pad 202 adjacent the edge of the submount facing the high frequency amplifier AMP. The submount shown in FIG. 15 has an electrode pad 204 and an electrode pad 206 instead of the electrode pads 66 and 67 of the first embodiment. They have a rectangular configuration and extend parallel to each other along the long side LA of the submount. In FIG. 15 the electrode pad 206 is disposed on the side of the submount facing the high frequency amplifier AMP.

It should be noted that the impedance of an electrode pad can be varied by varying its shape. Therefore, in the semiconductor photodetector device 10 of the present embodiment, the electrode pads 66 and 67 to which the wires 53 and 55 are connected may have a shape different from those shown in FIG. 5, e.g., may have an elongated rectangular shape or complicated shape, so that they have the desired impedance. The submount shown in FIG. 16 has an electrode pad 208 instead of the electrode pad 66 of the first embodiment. The electrode pad 208 has a first portion 208a and a second portion 208b which are integrally connected by a bent portion 208c. The first portion 208a and the second portion 208b extend parallel to the short side LB and the long side LA, respectively, of the submount and form an angle of 90 degrees. The submount also has an electrode pad 210 instead of the electrode pad 67 of the first embodiment, with the electrode pad 210 being slightly smaller than the electrode pad 67. The submount shown in FIG. 17 has a U-shaped electrode pad 212, as viewed in plan, instead of the electrode pad 66 of the first embodiment. The electrode pad 212 has: a first portion 212a disposed on the left side of the submount SB, as viewed in FIG. 17, and extending parallel to the short side LB of the submount SB; a second portion 212b disposed on the side of the submount SB opposite to that facing the high frequency amplifier AMP and extending parallel to the long side LA of the submount SB; and a third portion 212e disposed on the right side of the submount SB, as viewed in FIG. 17, and extending along the short side LB of the submount SB. Thus, both the first portion 212a and the third portion 212e extend parallel to the short side LB of the submount SB, but the third portion 212e is shorter and wider than the first portion 212a. The first portion 212a and the second portion 212b are integrally connected by a bent portion 212c and form an angle of 90 degrees, while the second portion 212b and the third portion 212e are integrally connected by a bent portion 212d and form an angle of 90 degrees. An electrode pad 214 is formed in the area defined by the U-shaped electrode pad 212. Specifically, the electrode pad 214 has a main portion 214a disposed at approximately the central portion of the top surface of the submount SB and surrounded by the electrode pad 212. The semiconductor photodetector APD is bonded to the main portion 214a. Further, the electrode pad 214 also has a projection 214b extending toward the short side LB (or the right edge) of the submount SB.

Figure 16:
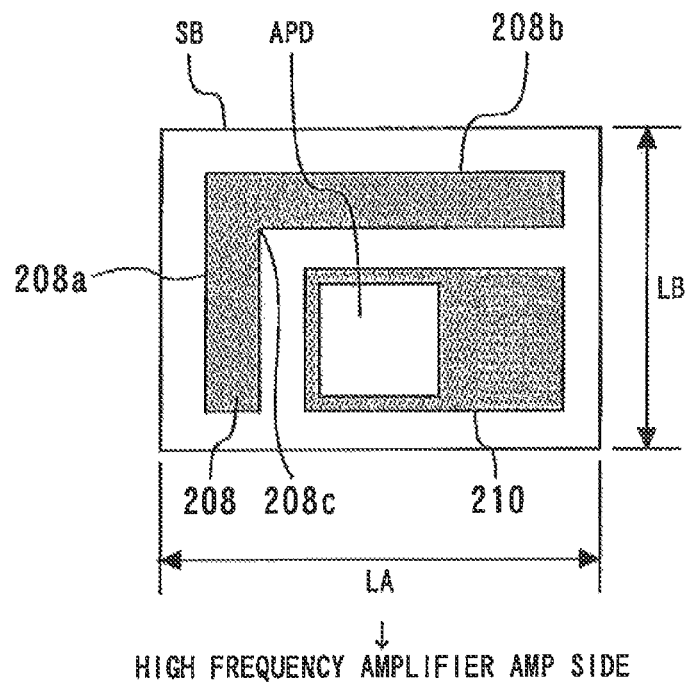
Figure 17:
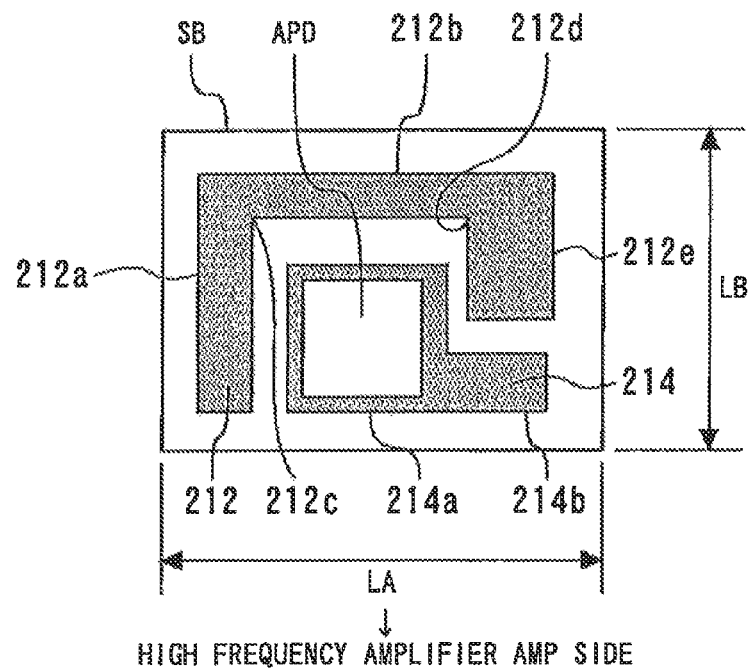
Figure 18:
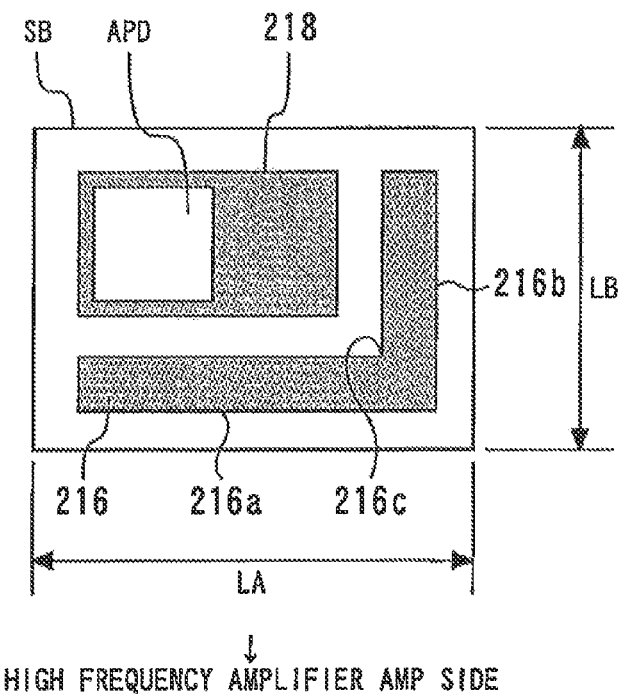

The submount SB shown in FIG. 18 has an electrode pad 216 which is a 180 degree rotated version of the electrode pad 208 shown in FIG. 16. The electrode pad 216 is disposed near the lower right corner of the submount SB instead of the upper left corner, as viewed in FIG. 18. The submount SB also has an electrode pad 218 which is similar to the electrode pad 210 shown in FIG. 16. The electrode pad 218 is disposed near the upper left corner of the submount SB instead of the lower right corner. The semiconductor photodetector APD is bonded to the electrode pad 218 at a location adjacent the upper left corner of the submount SB. In the submounts shown in FIGS. 16 to 18, the electrode pad electrically connected to the high frequency grounding pad 62 by the wire 53 is of an L-shape or U-shape, in plan, having a bent portion or portions. It should be noted, however, that the present embodiment also encompasses submounts provided with an electrode pad of a shape, in plan, having a projection(s) or both a bent portion(s) and a projection(s).

Figure 19:
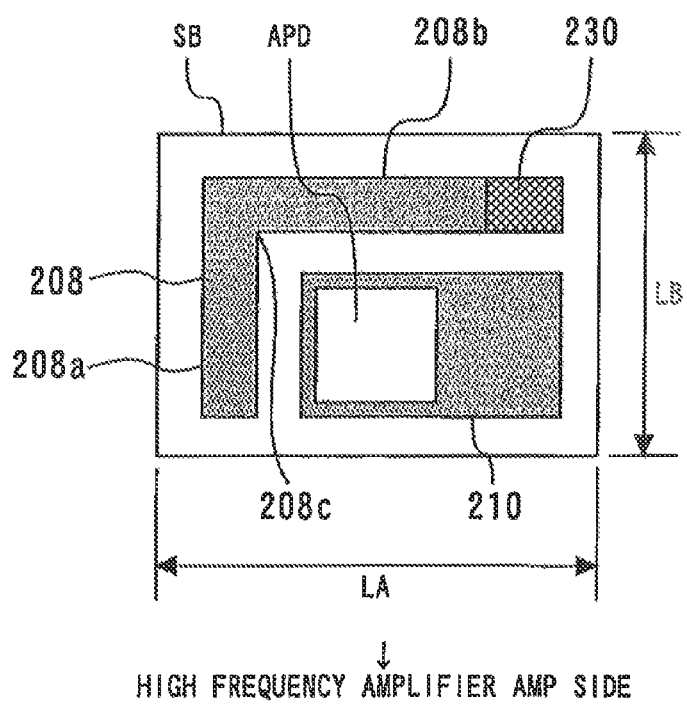
Figure 20:
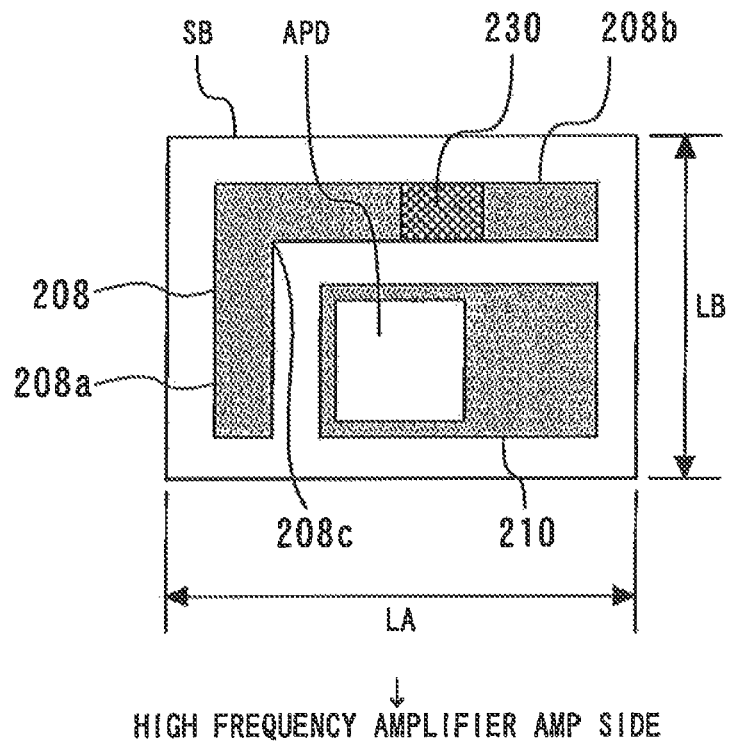

The submount shown in FIG. 19 is similar to that shown in FIG. 16, except that the electrode pad 208 has a resistive pattern portion 230 at the leading end of the second portion 208b. Specifically, the electrode pad 208 has a conductive pattern portion made of the same material as the electrode pad 210 and has the resistive pattern portion 230 having a higher resistance than the conductive pattern portion. The submount shown in FIG. 20 is similar to the submount of FIG. 19, except that the electrode pad 208 has the resistive pattern portion 230 at or near the center of the length of the second portion 208b. In this way the impedance of the electrode pad 208 can be adjusted.

Figure 21:
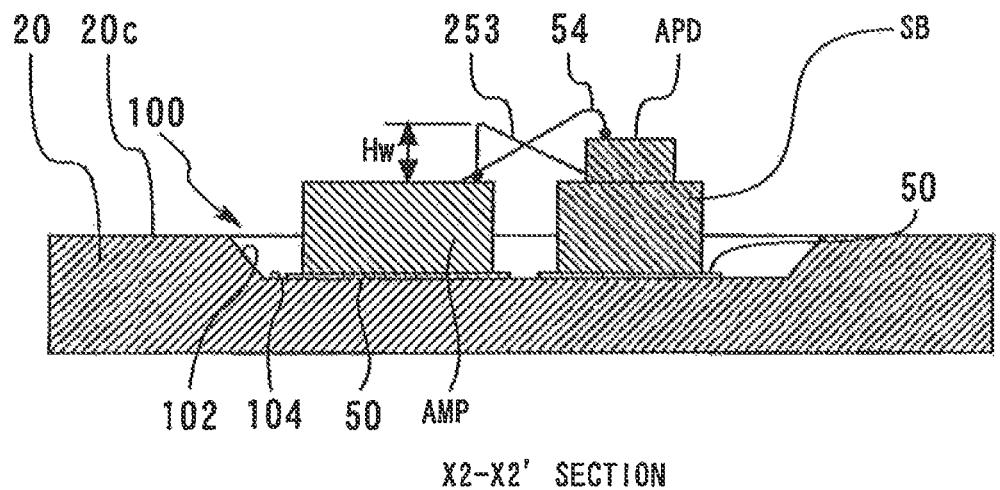
FIG. 21 is a cross-sectional view of a semiconductor photodetector device which is another variation of the semiconductor photodetector device of the present embodiment.

FIG. 21 is a cross-sectional view of a semiconductor photodetector device which is another variation of the semiconductor photodetector device of the present embodiment. The cross-section shown in FIG. 21 corresponds to the cross-section shown in FIG. 3. The semiconductor photodetector device shown in FIG. 21 includes a wire 253 instead of the wire 53 of the present embodiment. The wire 253 has a longer rising portion than the wire 53. The height Hw of this rising portion may be, e.g., 200 μm or more. The height Hw may be adjusted to adjust the length and the impedance of the wire 253.

Comparative Example for Embodiment

Figure 22:
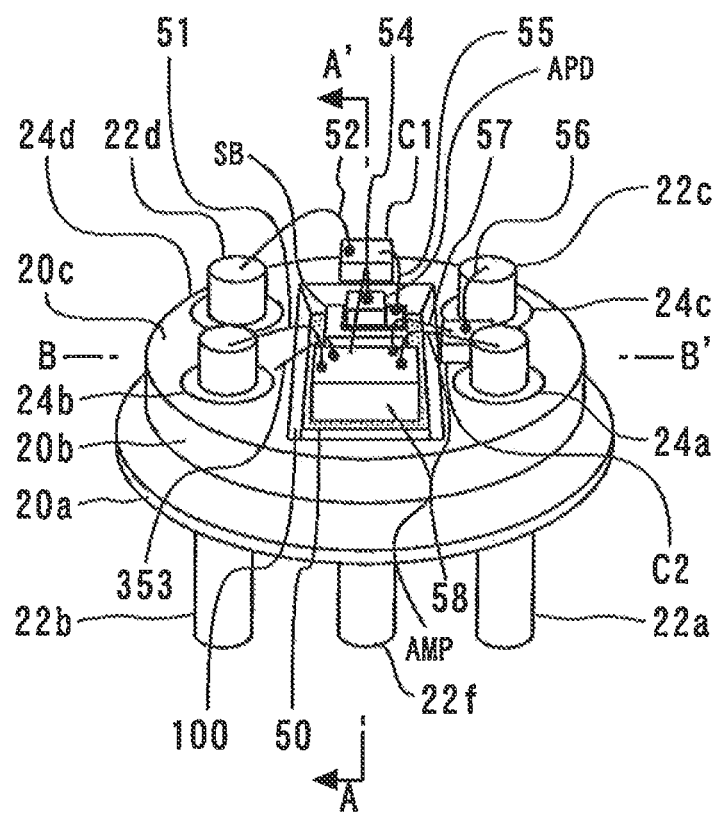
FIGS. 22 to 24 are diagrams showing a comparative example for the semiconductor photodetector device of the present embodiment.
Figure 23:
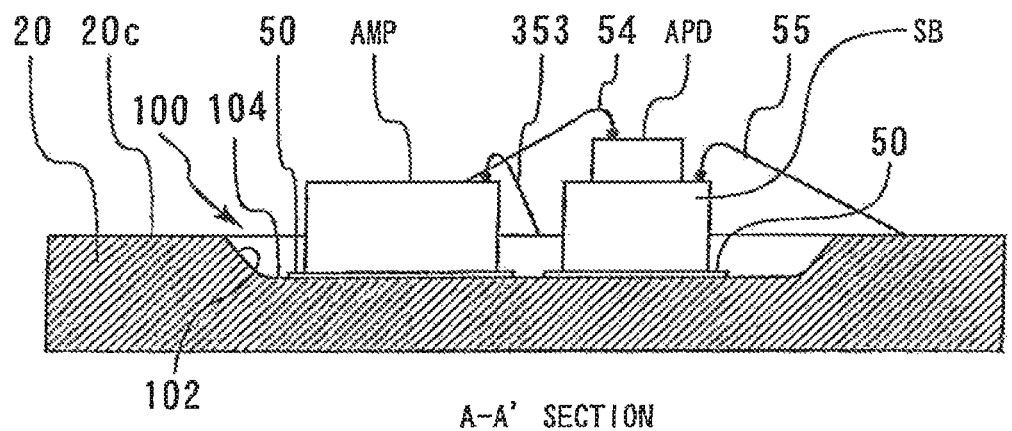
Figure 24:
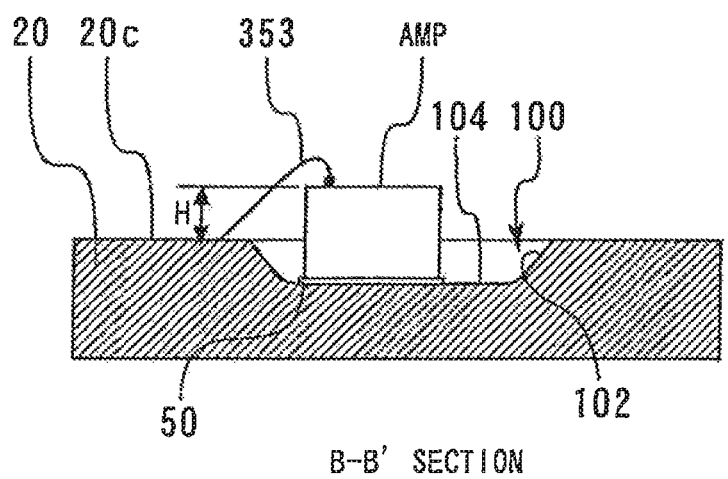

FIGS. 22 to 24 are diagrams showing a comparative example for the semiconductor photodetector device of the present embodiment. This comparative semiconductor photodetector device is similar in configuration to the semiconductor photodetector device 90 (which is a variation of the semiconductor photodetector device 10 of the present embodiment), except that the wire 53 is replaced by a wire 353 and the submount SB is not provided with the electrode pad 66. One end of the wire 353 is bonded to the high frequency grounding pad 62 of the high frequency amplifier AMP by a first bond, and the other end of the wire 353 is bonded to the top surface 20c of the header 20 by a second bond.

FIG. 23 is a cross-sectional view taken along line A-A' of FIG. 22 and viewed in the direction of the arrows, and FIG. 24 is a cross-sectional view taken along line B-B' of FIG. 22. The wire 353 is connected between the high frequency grounding pad 62 and the top surface 20c of the header 20 which are separated by a considerable distance, or height. This means that the wire bonding of the wire 353 is more difficult than the wire bonding of the wire 53 in the present embodiment, resulting in reduced productivity. Furthermore, the length of wire required to connect the high frequency grounding pad 62 to the top surface 20c of the header 20 is longer than would be the case if the high frequency grounding pad 62 and the top surface 20c were located at the same level, by an amount roughly equal to the height of the high frequency grounding pad 62 relative to the top surface 20c of the header 20. In the case of the semiconductor photodetector device 10 of the present embodiment and the semiconductor photodetector device 90 described above with reference to FIGS. 9 to 13, on the other hand, the wire 53 is wire-bonded between the high frequency grounding pad 62 and the electrode pad 66 on the submount SB which are substantially level with each other, thus facilitating the bonding of the wire 53 and minimizing the length of the wire 53. For example, the wire 53 is shorter than the wire 353 of the comparative semiconductor photodetector device by approximately 100 μm.

Further, as shown in FIG. 24, the high frequency amplifier AMP cannot be disposed adjacent to the upper edge of the recess 100, since the side 102 of the recess 100 is not perpendicular to the bottom surface 104 of the recess 100, as described above with reference to FIGS. 12 and 13. This means that the point on the top surface 20c of the header 20 to which the wire 353 is connected by a second bond is spaced a substantial lateral distance from the point on the high frequency grounding pad 62 to which the wire 353 is connected by a first bond. In the case of the semiconductor photodetector device 90, which is a variation of the semiconductor photodetector device 10 of the present embodiment, on the other hand, the wire 53 is connected from the high frequency grounding pad 62 of the high frequency amplifier AMP to the electrode pad 66 of the submount SB instead of to the top surface 20c of the header 20 and hence can be relatively short, thus eliminating the above problem associated with the configuration of the recess 100.

The features and advantages of the present invention may be summarized as follows. In the semiconductor photodetector device of the present invention, the top surface of the submount is greater than the footprint of the semiconductor photodetector mounted thereon, and an electrode pad for high frequency grounding is provided on the top surface in an area not occupied by the semiconductor photodetector, etc. In this way, the available area on the top surface of the submount is utilized for connection of a wire for high frequency grounding, thus making it possible to reduce the number of wires wire-bonded to the top surface of the header.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-025660, filed on Feb. 13, 2013, including specification, claims, drawings, and summary, on which the Convention priority of the present application is based, is incorporated herein by reference in its entirety.

What is claimed is:

1. A semiconductor photodetector device comprising:
    a header having a top surface;
    a high frequency amplifier located on the top surface of the header and having a top surface with a high frequency grounding pad disposed on the top surface of the high frequency amplifier;
    a submount located on the top surface of the header and having a top surface;
    first and second electrode pads disposed on and in physical contact with the top surface of the submount, adjacent to each other, and spaced apart from each other;
    a semiconductor photodetector having a footprint smaller than the first electrode pad and bonded to the first electrode pad at the top surface of the submount; and
    a wire connected at a first end to a connection point on the high frequency grounding pad and at a second end to a connection point on the second electrode pad.

2. The semiconductor photodetector device according to claim 1, wherein:
    the high frequency grounding pad is located at a first height relative to the top surface of the header and the second electrode pad is located at a second height, relative to the top surface of the header; and
    the difference between the first and second heights is less than the first height.

3. The semiconductor photodetector device according to claim 1, wherein the high frequency amplifier and the submount are disposed in contact with each other on the top surface of the header.

4. The semiconductor photodetector device according to claim 1, wherein:
    the header has a recess in the top surface of the header;
    the recess has a bottom surface and a side connected to the bottom surface at an angle of more than 90 degrees, wherein the side surrounds the bottom surface;
    the high frequency amplifier and the submount are disposed on the bottom surface of the recess; and
    the connection point on the high frequency grounding pad is spaced from an edge of the recess by a first distance, in a direction parallel to the top surface of the header, and spaced from the connection point on the second electrode pad by a second distance, in the direction parallel to the top surface of the header, and the second distance is shorter than the first distance.

5. The semiconductor photodetector device according to claim 1, wherein:
    the header is plated with gold; and
    at least one of the high frequency amplifier and the submount is bonded to the header with a silver paste containing silver and a binder resin.

6. The semiconductor photodetector device according to claim 1, wherein the second electrode pad has a shape, when viewed transverse to the top surface of the high frequency amplifier, having at least one of a bent portion and a projection.

7. The semiconductor photodetector device according to claim 1, wherein the second electrode pad has a conductive pattern portion and a resistive pattern portion having a higher resistance than the conductive pattern portion.

* * * * *